United States Patent
Bhalla et al.

(10) Patent No.: US 7,453,119 B2
(45) Date of Patent: Nov. 18, 2008

(54) SHIELDED GATE TRENCH (SGT) MOSFET CELLS IMPLEMENTED WITH A SCHOTTKY SOURCE CONTACT

(75) Inventors: Anup Bhalla, Santa Clara, CA (US); Sik K. Lui, Sunnyvale, CA (US)

(73) Assignee: Alphs & Omega Semiconductor, Ltd. (BM)

( * ) Notice: Subject to any disclaimer, the term of this patent is extended or adjusted under 35 U.S.C. 154(b) by 120 days.

(21) Appl. No.: 11/373,024

(22) Filed: Mar. 10, 2006

(65) Prior Publication Data
US 2006/0209887 A1    Sep. 21, 2006

Related U.S. Application Data

(63) Continuation-in-part of application No. 11/056,346, filed on Feb. 11, 2005, now Pat. No. 7,285,822.

(51) Int. Cl.
*H01L 29/94* (2006.01)
(52) U.S. Cl. .............. 257/330; 257/331; 257/332; 257/333; 257/449; 257/471; 257/E51.009
(58) Field of Classification Search ......... 257/330–334, 257/449, 471, 478, E51.009
See application file for complete search history.

(56) References Cited

U.S. PATENT DOCUMENTS

| 6,031,265 A | 2/2000 | Hshieh |
| 6,071,552 A | 6/2000 | Ku |
| 6,388,266 B1 | 5/2002 | Baliga |
| 2003/0020134 A1* | 1/2003 | Werner et al. ............... 257/471 |
| 2005/0199918 A1* | 9/2005 | Calafut et al. ............... 257/260 |

* cited by examiner

*Primary Examiner*—Evan Pert
*Assistant Examiner*—Tan N Tran
(74) *Attorney, Agent, or Firm*—Bo-In LIn

(57) ABSTRACT

This invention discloses a semiconductor power device that includes a plurality of power transistor cells surrounded by a trench opened in a semiconductor substrate. At least one active cell further includes a trenched source contact opened between the trenches wherein the trenched source contact opened through a source region into a body region for electrically connecting the source region to a source metal disposed on top of an insulation layer wherein a trench bottom surface of the trenched source contact further covered with a conductive material to function as an integrated Schottky barrier diode in said active cell. A shielding structure is disposed at the bottom and insulated from the trenched gate to provide shielding effect for both the trenched gate and the Schottky diode.

20 Claims, 13 Drawing Sheets

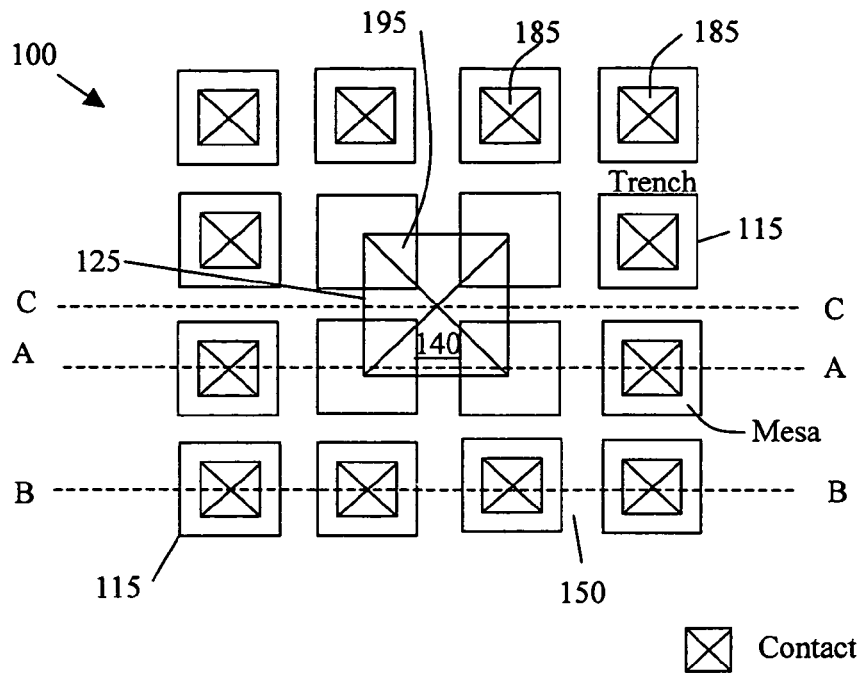
Fig. 3A
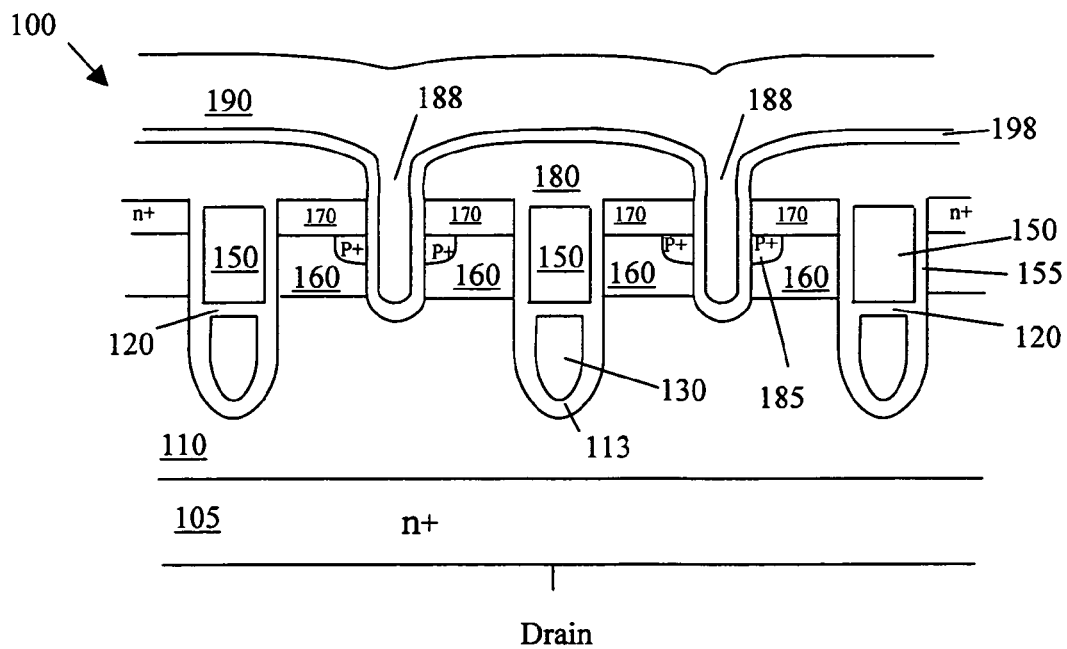
Fig. 3B Section B-B

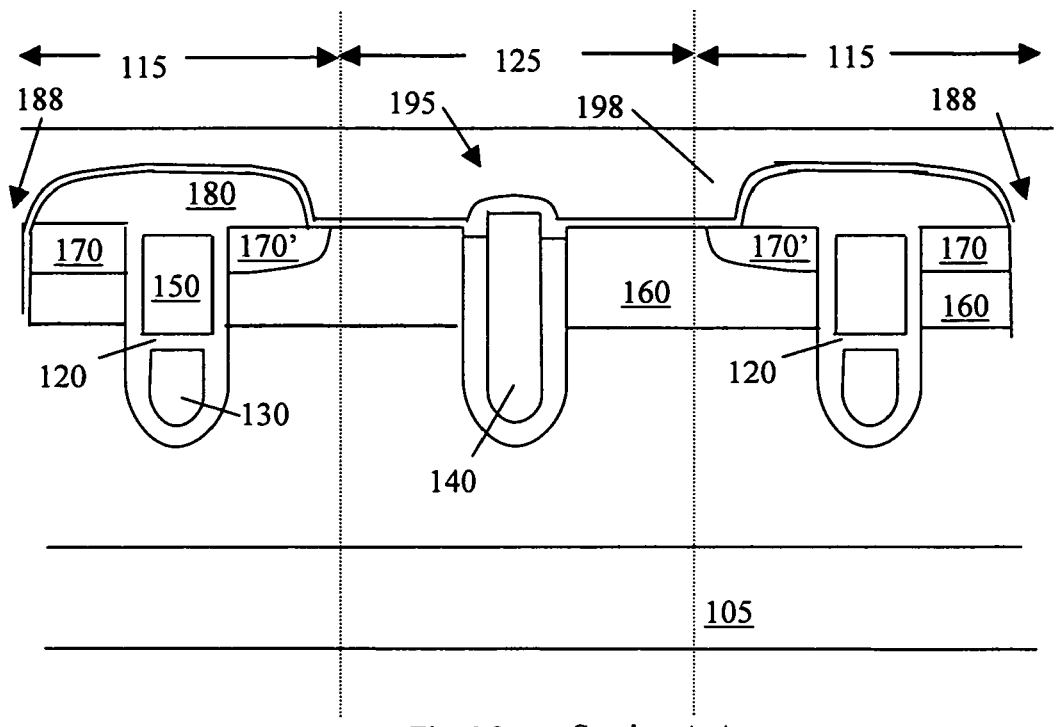
Fig. 3C  Section A-A
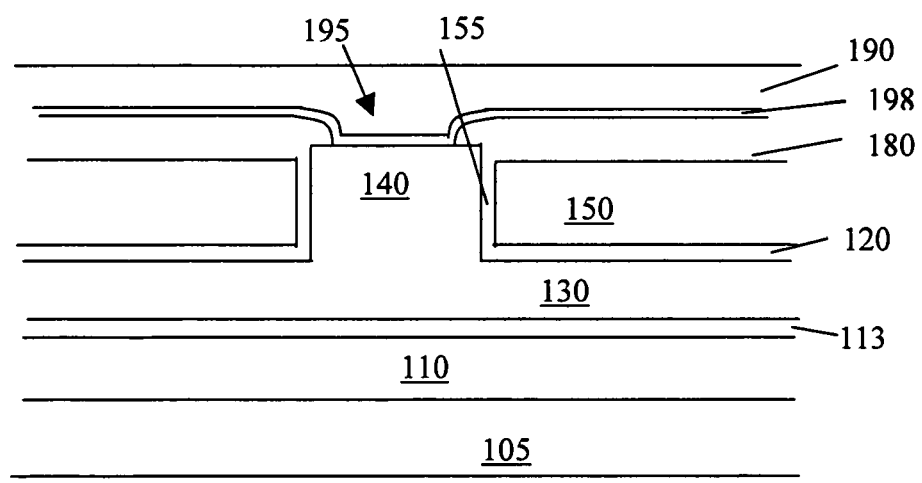
Fig. 3D Section C-C

SHIELDED GATE TRENCH (SGT) MOSFET CELLS IMPLEMENTED WITH A SCHOTTKY SOURCE CONTACT

This Patent Application is a Continuation in Part (CIP) Application of Ser. No. 11/056,346 (issued into U.S. Pat. No. 7,285,822 on Oct. 23, 2007) filed by a common Inventor of this Application on Feb. 11, 2005. The Disclosures made in that Application is hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with shielded trench gates with cells provided with Schottky source contact for improving performance of high frequency power switching, H-bridge and synchronization rectification applications.

2. Description of the Related Art

In order to reduce the power consumptions and to increase the switching speed of a power semiconductor power device, it is desirable to further reduce the on-resistance and the gate capacitance. Integration of an Schottky diode in a semiconductor power device such as a metal oxide silicon field effect transistor (MOSFET) has been implemented. FIGS. 1A and 1B show the standard MOSFET devices that integrate the Schottky diodes to bypass the body diode thus improving the behavior of a MOSFET device. Improvements in the MOSFET device performances enhance the H-bridge and synchronization rectification applications. Specifically, FIG. 1A shows FIG. 1A shows a MOSFET with an integrated Junction Barrier controlled Schottky (JBS) area. The integrated JBS may be a Schottky diode array with a P-N junction grid interspersed between the Schottky contacts. The P-N junction will pinch-off the channel regions under the Schottky contacts to inhibit the formation of large reverse leakage current once a threshold reverse-biased voltage is applied. The shielding effect caused by the depletion layer also improves the breakdown voltage. However, there is a tradeoff that there is an increase of the series resistance. Also, since the presence of P-N junction in the integrated JBS regions takes up a large portion of surface area, for practical considerations, it may be required to reduce the overall Schottky contact areas dedicated to the forward conduction. Under the circumstance, there is an increase of the on-state forward voltage cause by this reduction of the overall Schottky contact area. In FIG. 1B, the integrated trench MOS barrier Schottky (TMBS) is implemented. The integrated TMBS includes Schottky diode array interspersed with MOS trench. The charge coupling between the majority charge carrier in the mesa-shaped portion of the epitaxial/drift region and the metal on the insulated sidewalls of the trenches causes a redistribution of the electric filed profile under the Schottky contact which improves the breakdown and reduces reverse leakage current.

U.S. Pat. No. 4,675,713 discloses a method of using the source Schottky junction as the body contact for a semiconductor power device. U.S. Pat. No. 4,983,535 discloses a fabrication method to manufacture a DMOS device with a source implemented with a refractory metal Schottky barrier located on top of the body region. However, these devices still have the limitations of using metals of relatively high barrier height. The device performance cannot satisfy the modern applications that require further reduction of the on resistance and higher drive currents.

FIG. 2 shows an improved DMOS submitted as a co-pending application by co-inventors of this patent application. The DMOS has an improved configuration. Specifically, in proximity of the gate trench and adjacent to the source, there is a source-body contact trench with an anti-punch through implant disposed along the trench wall. An integrated Schottky diode is formed by depositing a high barrier height metal at the bottom of the source-body contact trench to function as the integrated Schottky contacts. A low barrier height metal is further deposited overlaying the high barrier height metal to provide ohmic contact for source and body. The DMOS device as shown in FIG. 2 provides the advantage of integrating a Schottky in every cell with no loss of die active area to form such a Schottky as in older approach. However, the high barrier height metal as required to achieve acceptable low leakage current in the off state presents a disadvantage due to the higher costs of depositing both the high barrier height metal and the low barrier height metal to meet the requirements of Schottky and source-body ohmic contact.

Additionally, the above device configurations as shown in FIGS. 1A, 1B and 2 are still limited by a relatively high gate-to-drain capacitance (Cgd) caused by the coupling between the trenched gate and the drain disposed on the bottom portion of the substrate. For power transistors including MOSFET and IGBT, new device configurations and manufacturing processes have been disclosed implemented with different gate structures including a shielded gate trench (SGT) structure to reduce the speed-limiting capacitance between the gate and the drain of these switching power devices. The technologies as disclosed are still confronted with technical limitations and difficulties. As there are growing demands for high frequency switch power devices, an urgent need exists to provide effective solutions for resolving these technical difficulties and limitations.

Baliga discloses in U.S. Pat. No. 5,998,833 a DMOS cell as shown in FIG. 1C. A source electrode is placed underneath the trenched gate to reduce the gate-to-drain capacitance. The gate of the DMOS cell is divided into two segments. The gate-to-drain capacitance is reduced because the contributions to capacitance from the gate-drain overlapping areas are eliminated.

In U.S. Pat. No. 6,690,062, a MOSFET device as shown in FIG. 1D is disclosed where the switching behavior of a transistor configuration is improved by providing a shielding electrode in an edge region. The shielding electrode surrounds at least sections of an active cell array. There is a capacitance between an edge gate structure and a drain zone. The shielding electrode located in the edge region reduces the gate-drain capacitance $C_{GD}$ of the transistor.

In U.S. Pat. No. 6,891,223, Krumrey et al. disclose a transistor that includes transistor cells disposed along trenches in a semiconductor substrate with two or more electrode structures disposed in the trenches. Furthermore, metallization structures are disposed above the substrate surface as shown in FIG. 1E. The trenches extend into an inactive edge region of the transistor. An electrical connection between the electrode structures and corresponding metallization are established in the edge regions.

The above patented-disclosures including transistor configurations still have a common difficulty. The source electrode disposed on the trench bottom is connected to the source voltage through an edge area of the semiconductor power device. This inevitably increases the source electrode resistance. Furthermore, the extra masks needed to create such connection also increase the cost of manufacturing.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device implemented with the shielded gate trench (SGT) structure that has the bottom shielding electrode provided with improved connection more directly to the source voltage. Specifically, a macro-cell layout approach is disclosed. In the macro-cell, a trench filled with conductive polysilicon is employed to electrically connect the bottom shielding electrode of the SGT structure directly to the source metal. The above-discussed problems and difficulties of the source voltage connections via the peripheral portions of the device in the above-discussed conventional configurations are therefore resolved.

Another aspect of this invention is to combine the new and improved SGT connections with the integrated Schottky source contact trench configuration to further improve the MOSFET switching performance and improve the area efficiency of the integrated Schottky. A metal layer of low barrier height is formed to cover a source contact trench thus functioning as an integrated Schottky contact to bypass the body diode thus improving the device performance. Meanwhile punch through prevention is provided in the source contact Schottky by forming a punch through implant region disposed along the trench walls.

Specifically, it is an aspect of the present invention to provide improved SGT device configuration and manufacturing method to reduce the gate to drain capacitance. The device further includes source contact trenches opened through the body region and covered with a low barrier height metal layer such as Ti or TiSi2 layer to function as Schottky barrier diode to bypass the body diode thus improving the behavior of the power MOSFET devices. The devices disclosed in this invention are especially useful for application in H-bridge and synchronous rectification application.

Briefly in a preferred embodiment this invention discloses a trenched semiconductor power device. The trenched semiconductor power device includes a plurality of interconnected trenches form on a semiconductor substrate. At least one of the interconnected trenches constitutes a shielded gate trench (SGT) for the semiconductor power device. The SGT includes a trenched gate disposed on an upper portion of the SGT and a bottom shielding electrode disposed on a bottom portion of the SGT insulated from the trenched gate. At least one of the interconnected trenches constitutes a source-connecting trench filled with a conductive trench-filling material electrically connected to the bottom shielding electrode of the SGT for electrically connecting to a source metal disposed on top of the source-connecting trench. The trenched semiconductor power device further includes a trenched source contact opened between the gate trenches extended through a source region into a body region for electrically connecting the source region to a source metal disposed on top of the insulation layer. The trenched source contacts further covered with a low barrier height metal layer such as a Ti/TiN or TiSi$_2$/TiN layer to function as an integrated Schottky barrier diode in each cell of the power semiconductor device thus improving the device performance. The semiconductor power device further includes a punch through prevention region doped with a body type dopant along trench walls of the source contact trenches for preventing a punch through of the semiconductor power device.

Another embodiment of this invention includes a shielding structure disposed at the bottom of the trenched gate and insulated from the trenched gate. The shielding structure extends to a depth deeper than the bottom of source contact trench where the Schottky diode is formed. The shielding structure provides shielding effect for the trenched gate thus leading to the reduction of gate drain capacitance Cgd therefore improves the switching speed. The shielding structure further provides shielding effect for the trenched Schottky leading to the reduction of leaking current therefore enable the use of low barrier height material for the Schottky contact to improve the Schottky junction resistance without trading off leaking current that constantly challenging designers while trying to optimize a pair of competing parameter.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 3A is a top view and 3B to 3D are three cross sectional views of a trenched MOSFET device implemented with improved configuration of this invention.

DETAILED DESCRIPTION OF THE METHOD

Figure 1A:
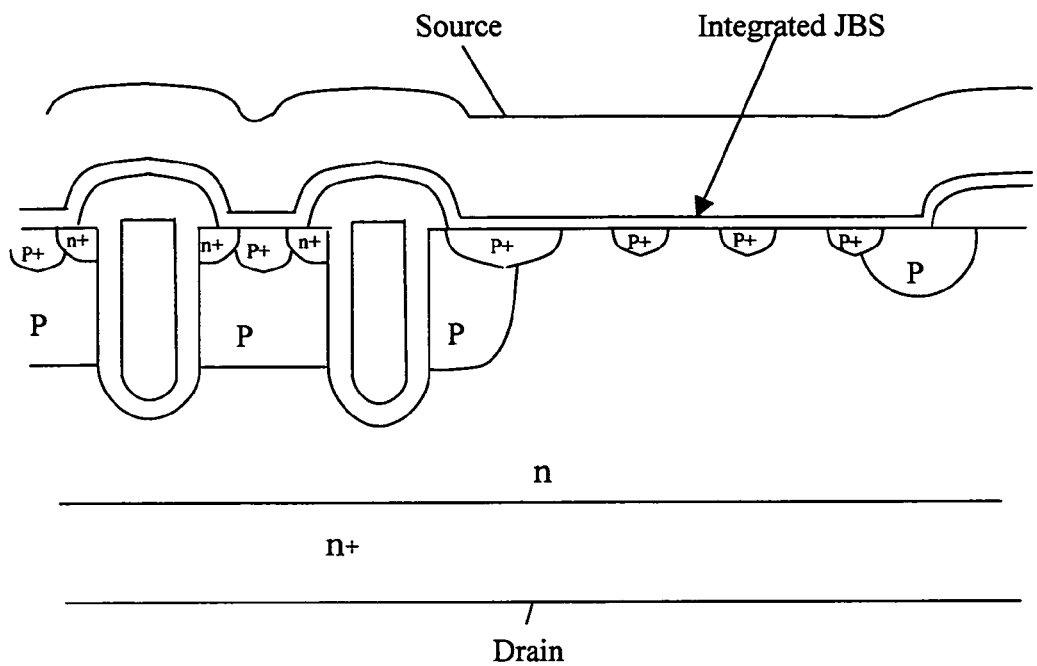
FIGS. 1A to 1E are cross sectional views of trenched MOSFET devices disclosed in prior art disclosures.
Figure 1B:
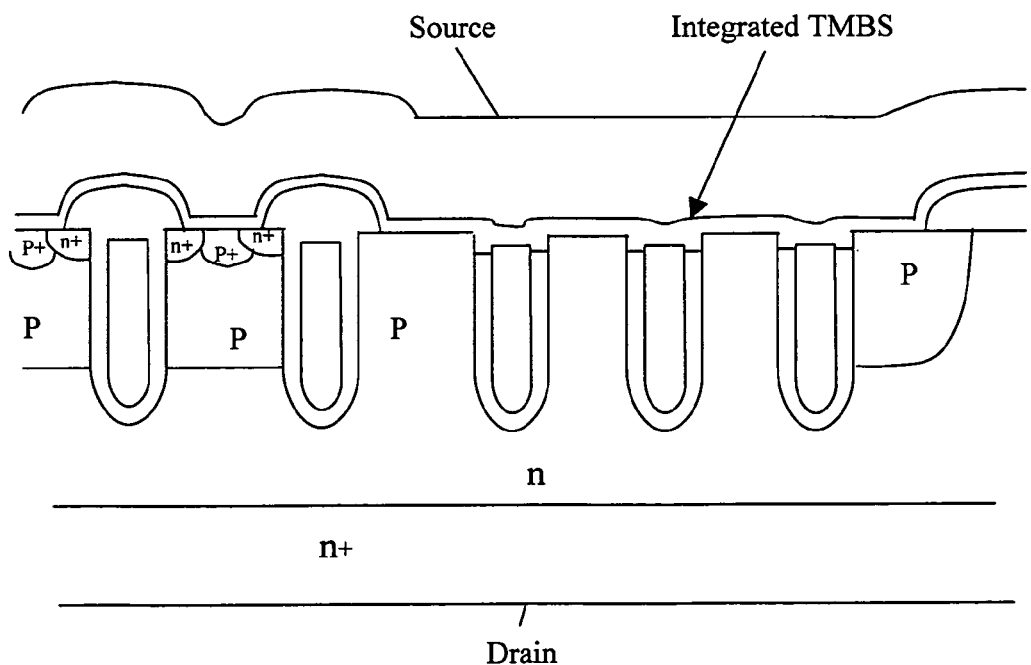
Figure 1C:
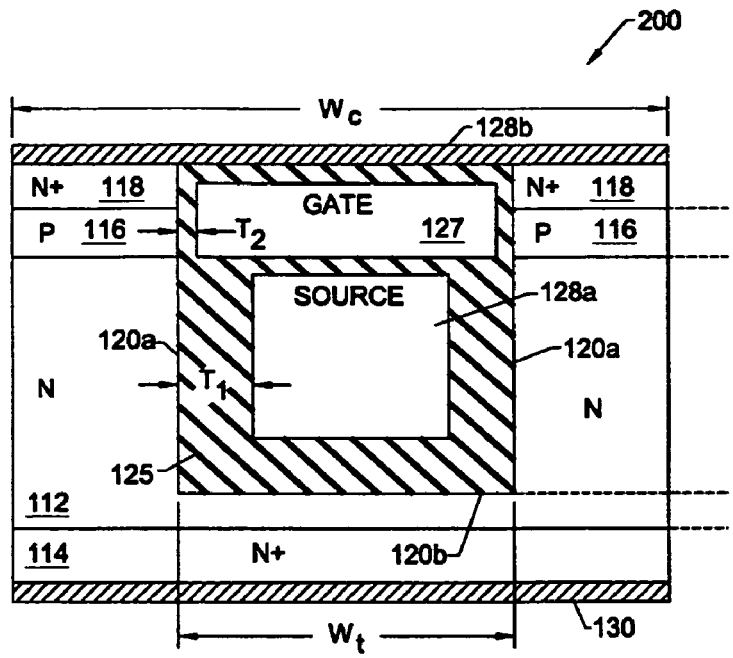
Figure 1D:
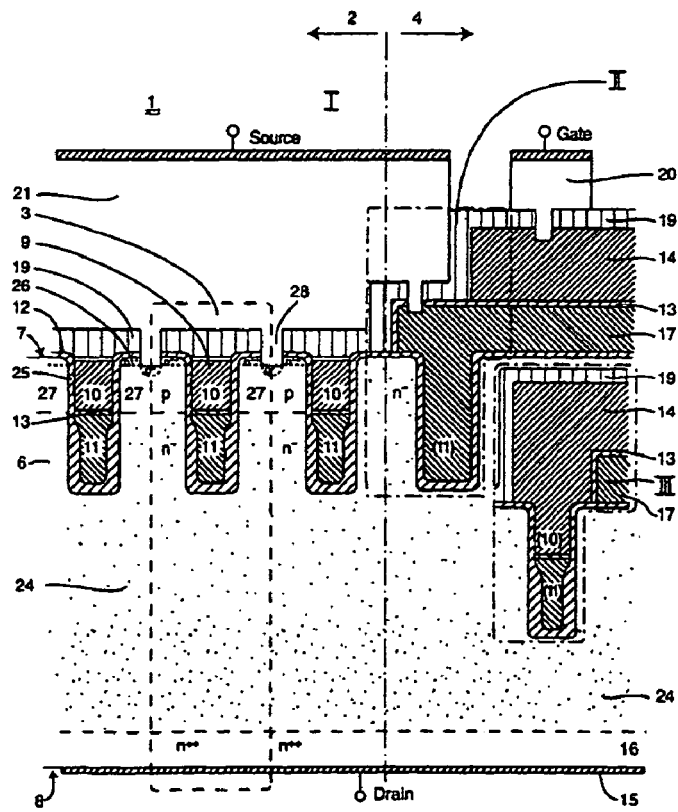
Figure 1E:
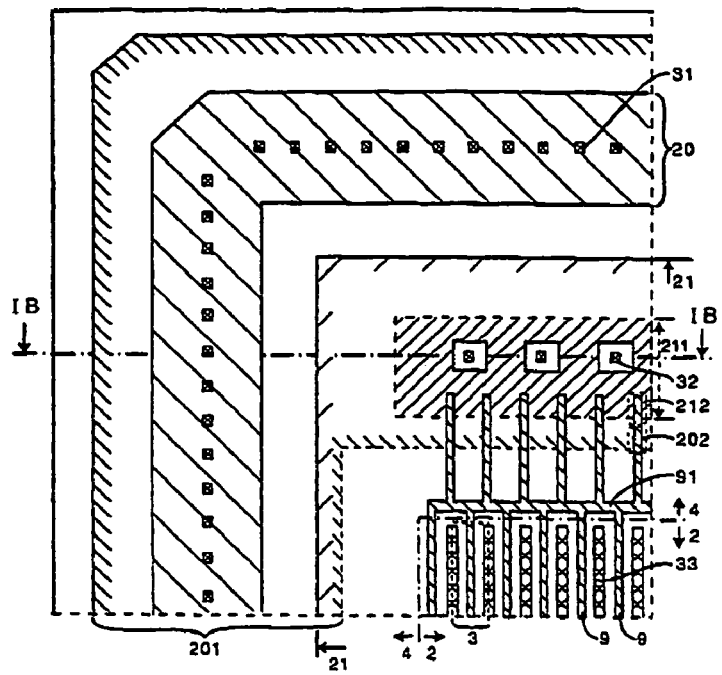
Figure 2:
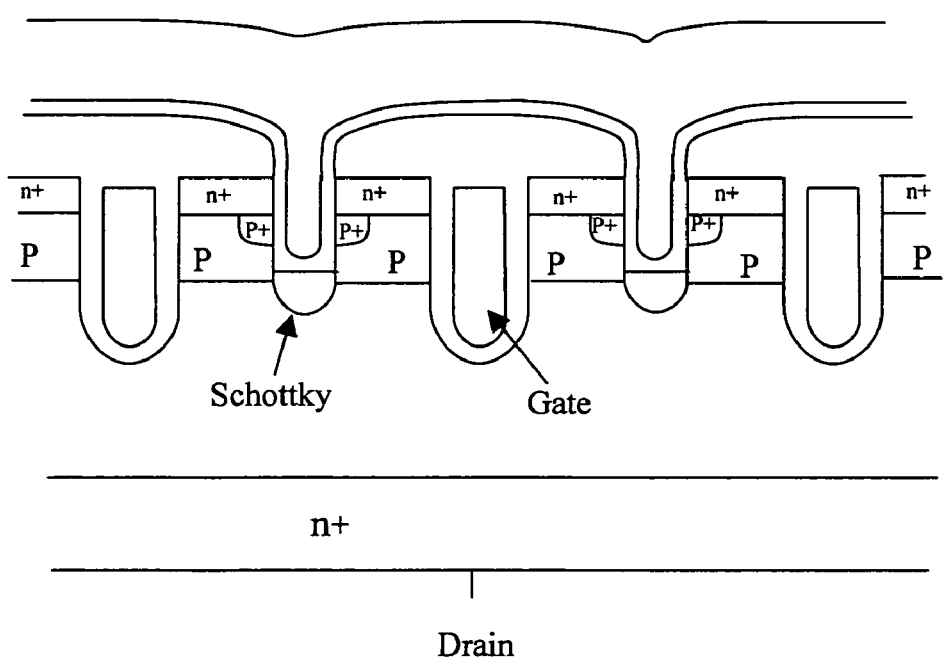
FIG. 2 is a cross sectional view of a MOSFET device with improved integrated Schottky diode configuration.

Referring to FIGS. 3A to 3D for a top view and three cross sectional views respectively of a trenched MOSFET device 100 of this invention. As shown in FIG. 3B, the trenched MOSFET device 100 is supported on a substrate 105 formed with an epitaxial layer 110. The trenched MOSFET device 100 includes a shielded gate trench (SGT) structure. The SGT structure includes a bottom shielding electrode 130 insulated from and disposed below a trenched gate 150. The bottom SGT structure 130 filled with a polysilicon therein is provided to shield the trenched gate 150 from the drain disposed below the trench bottom. The bottom SGT structure 130 is insulation from the drain region by a dielectric layer 113. An insulation layer 120 separates the bottom shielding electrode 130 from the trenched gate 150. The trenched gate 150 includes polysilicon filling in a trench surrounded with a gate insulation layer 155 covering the trenched walls. A body region 160 that is doped with a dopant of second conductivity type, e.g., P-type dopant, extends between the trenched gates 150. The P-body regions 160 encompassing source regions 170 and 170' doped with the dopant of first conductivity, e.g., N+ dopant. The source regions 170 and 170' are formed near the top surface of the epitaxial layer surrounding the trenched gates 150. In one embodiment, only source region 170 is formed, source region 170' is not formed.

On the top surface of the semiconductor substrate is also an insulation layer 180. The MOSFET device further includes source contact trenches 188 opened in the mesa contact areas between the trenched gates 150. The bottom of source contact trench 188 extends through the body region 160. There are also more heavily doped regions 185 formed along the side walls of the contact trenches 188 doped with a P+ dopant to provide good ohmic contact to the body regions. They also serve as punch-through prevention region. A metal layer 198 composed of Ti or TiSi2 is formed on top of the insulation layer 180. The metal layer 198 further covers the source contact trench walls and trench bottoms of the contact trenches 188. The metal layer 198 of Ti or TiSi2, or other low barrier height metals, deposited into the contact trenches 188 functions as a source ohmic contact on the trench sidewall and an integrated Schottky barrier diode to bypass the body diode at the bottom of the trench. A source metal and a gate metal (not shown) are formed on top of the Schottky barrier metal 198 for providing electrical contact to the source regions and to the gate (not shown). FIG. 3C shows the cross sectional view across the line A-A'. As shown in FIGS. 3A-3D, the bottom shielding electrode 130 is electrically connected to the source metal 190 through the trenched source connecting electrode 140. The trenched source connecting electrode 140 is electrically connected to the bottom shielding electrode 130 through the interconnected trenches that extended between the MOSFET cells.

FIG. 3A shows a macro cell layout of the device wherein each active cell has a square layout defined by surrounding trenches formed as trenched gates 150 with bottom shielding electrode functioning as the SGT structure. In region 195 where two trenches intersect, a source electrode is formed to electrically connect to bottom shielding electrode 130. This region 195 may be extended beyond the intersection so that the source connecting electrode 140 would extend into a portion of the trenches. Alternatively it is also possible to form the source connecting electrode 140 in a region 195 where trenches do not intersect. In addition to squares as shown in FIG. 3A, other kind of polygons, such as triangle, rectangular and hexagonal may also be implemented. Each macro cell as shown in FIG. 3A includes a plurality of active cells 115 and at least a region 125. The active cells 115 is defined and surrounded by trenched gates 150 while inside the area 125, the trenched source connecting electrode 140 is filled with gate filling material to electrically connect the bottom shielding electrode 130 to the source contact metal. FIG. 3C shows the boundary lines of the area 125 and the active cells 115. Furthermore, the bottom shielding electrode 130 of the SGT structure is shown as connected to the source-connecting trench 140 through interconnecting bottom shielding electrode 130 (in the active cell area 115) and also trench 140 (in the source-contact trench area 125). These trenches interconnect through a third dimension and via trenches behind and before the cross sectional surface as shown in FIG. 3D.

The DMOS devices as shown in FIGS. 3A to 3D thus combine the shielding gate trench structure, e.g., the SGT structure, with the trenched contact Schottky barrier in every active DMOS cell. The deep trenches with the source connected bottom shielding electrode shields the Schottky contact during the reverse blocking. This configuration provides special advantage that restricts a much lower leakage current even with low barrier height metals such as Ti or TiSi2. A significantly improved trade-off is achieved between the forward voltage Vf and the leakage current Ileak. The barrier height of metal decides the forward voltage and leakage current. It is desirable to lower the barrier height to lower the forward voltage, however that would cause an undesirable effect of increase in the leakage current. Since the shielding effect provided by the deep trench bottom shielding electrodes limits the increase of leakage current, the improved configuration as disclosed in this invention allows the use of low barrier height metal.

According FIGS. 3A to 3D and above descriptions, this invention discloses a trenched semiconductor power device. The trenched semiconductor power device includes a plurality of interconnected trenches form on a semiconductor substrate. At least one of the interconnected trenches constitutes a shielded gate trench (SGT) for the semiconductor power device. The SGT includes a trenched gate disposed on an upper portion of the SGT and a bottom shielding electrode disposed on a bottom portion of the SGT insulated from the trenched gate. At least one of the interconnected trenches constitutes a source-connecting trench filled with a conductive trench-filling material electrically connected to the bottom shielding electrode of the SGT for electrically connecting to a source metal disposed on top of the source-connecting trench. The trenched semiconductor power device further includes a trenched source contact opened between the gate trenches extended through a source region into a body region for electrically connecting the source region to a source metal disposed on top of the insulation layer. The trenched source contacts further extend through the body region covered with a low barrier height metal layer to function as an integrated Schottky barrier diode in each cell of the power semiconductor device thus improving the device performance. The semiconductor power device further includes a punch through prevention region doped with a body type dopant along trench walls of the source contact trenches for preventing a punch through of the semiconductor power device.

Figure 4A:
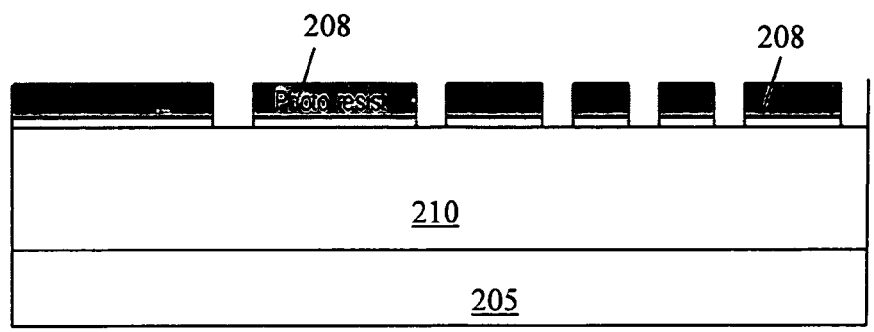
FIGS. 4A to 4N are a serial cross sectional views for describing the manufacturing processes to provide a trenched MOSFET device as shown in FIG. 3.
Figure 4B:
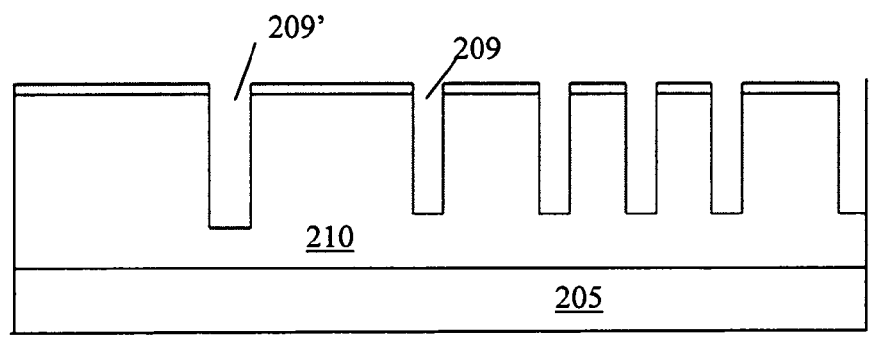
Figure 4C:
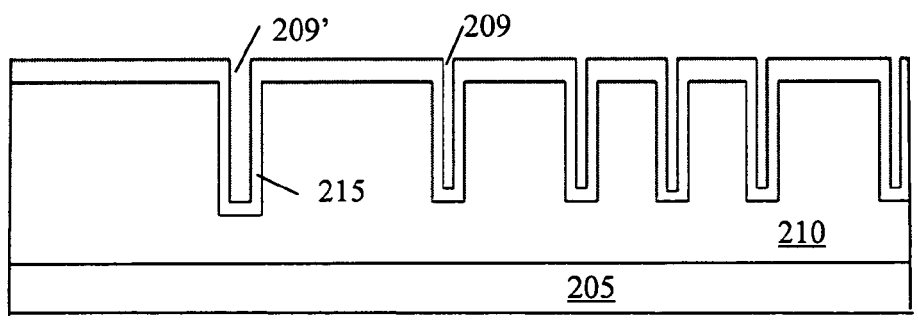

Referring to FIGS. 4A to 4L for a serial of side cross sectional views to illustrate the fabrication steps of a MOSFET device as that shown in FIGS. 3A to 3D. In FIG. 4A, a trench mask 208 is applied as first mask to create an oxide hard mask 206 and then removed. Referring to FIG. 4B, a trench etch process is carried out to open a plurality of trenches 209 in an epitaxial layer 210 supported on a substrate 205. The net depth as required for both electrodes and the targeted oxide thickness determines the trench depth. A gate runner trench 209' that is wider and deeper than the other trenches may also be formed in the same process. In FIG. 4C, a sacrificial oxidation is performed followed by an oxide etch to remove the damaged surface on the trench wall to smooth the sidewalls. Then a gate oxidation is performed to grow a gate oxide layer 215. A thick oxide layer 215 is grown to a thickness based on device optimization for low Rds and high breakdown voltage. A thicker oxide layer 215 here reduces the silicon surface electric field, allowing the use of higher doping and leading to lower Rds for the same breakdown rating.

Figure 4D:
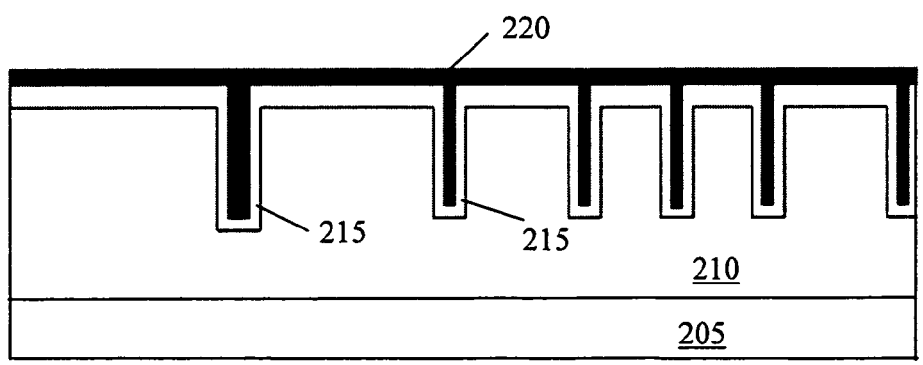
Figure 4E:
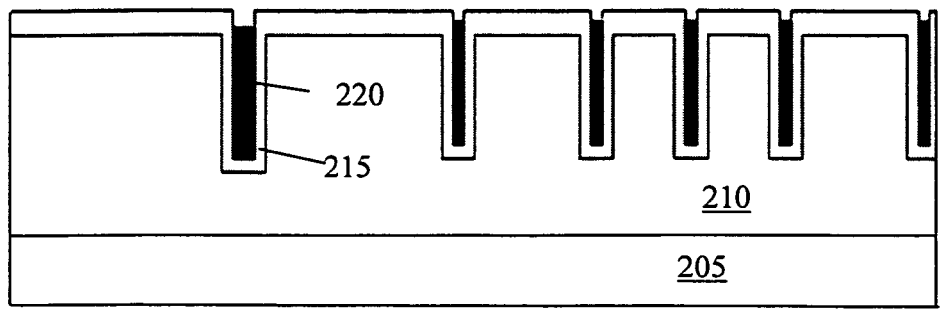
Figure 4F:
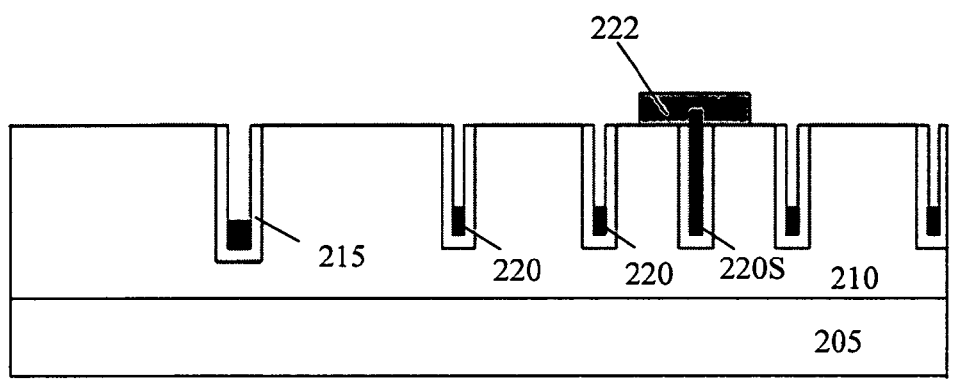
Figure 4G:
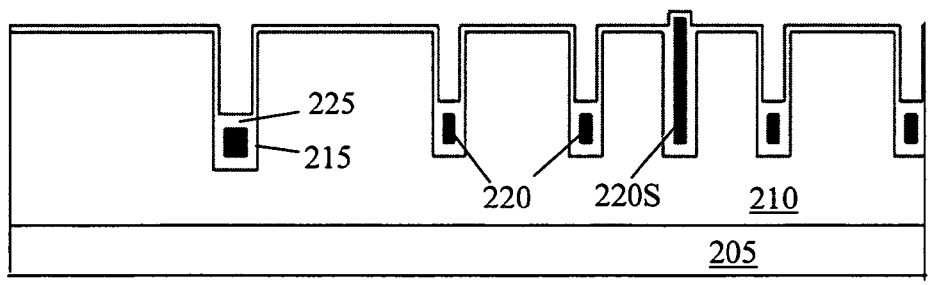
Figure 4H:
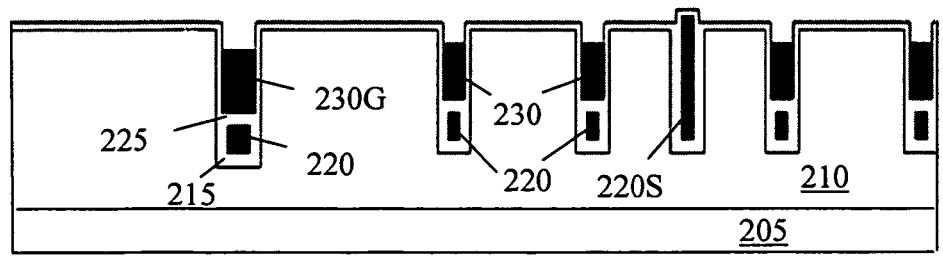

In FIG. 4D, a polysilicon layer 220 to form the bottom shielding electrode is deposited into the trenches 209 and gate runner trench 209'. In FIG. 4E, a blanket polysilicon etch back is performed to etch back the polysilicon layer 220. The polysilicon layer 220 is etched back without a mask until it is just below the top surface of the oxide. The oxide on top of the silicon is then removed using convention plasma etch process. In FIG. 4F, a second mask, i.e., a polysilicon mask 222, is applied to cover a portion of polysilicon layer 220S inside designated source connecting trenches. Then the polysilicon layer 220 is etched back to remove the upper portion of the trenches designated for trenched gate. The polysilicon 220 is etched to a target depth using a timed etch-back process. The polysilicon mask 222 is removed. The thick oxide on the side wall of the trench is stripped using a wet etch, until the sidewalls are clear in the area not encapsulated by the polysilicon. Care is taken to not excessively over etch this oxide within the lower portion of trench. In FIG. 4G, a thin gate oxide layer 225 is formed to cover the upper portion of trench wall and the top surface of the remaining bottom polysilicon layer 220 to form the bottom shielding electrode. A thin oxide on the gate trench sidewall provides the advantage of reducing gate threshold voltage. The gate oxidation process grows a thicker oxide over all the exposed poly regions, due to the well known enhanced oxidation in heavily doped polysilicon. This thicker oxide surrounding the bottom shielding electrode has the advantage of improving the breakdown voltage. In FIG. 4H, a gate polysilicon layer 230 is deposited into the gate trenches and etched back to form the trenched gate. This gate polysilicon layer 230 is simply etched back using no mask, until it lies just below the surface of the top silicon surface. A gate runner 230G is also formed in the same process.

Figure 4I:
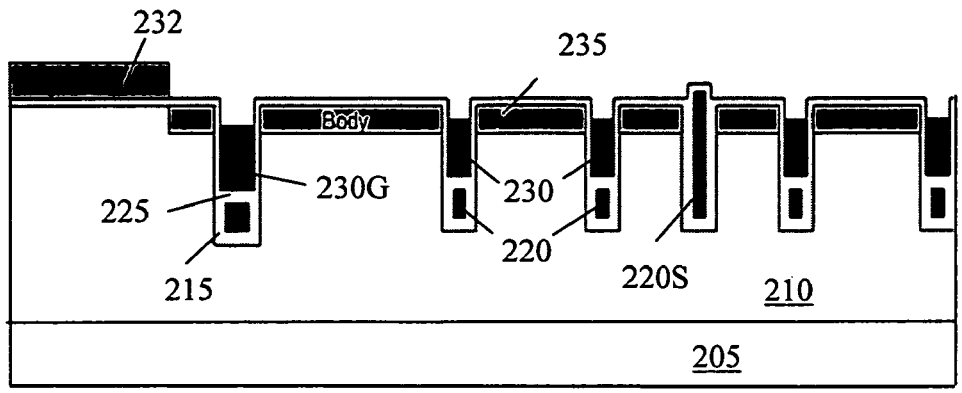
Figure 4J:
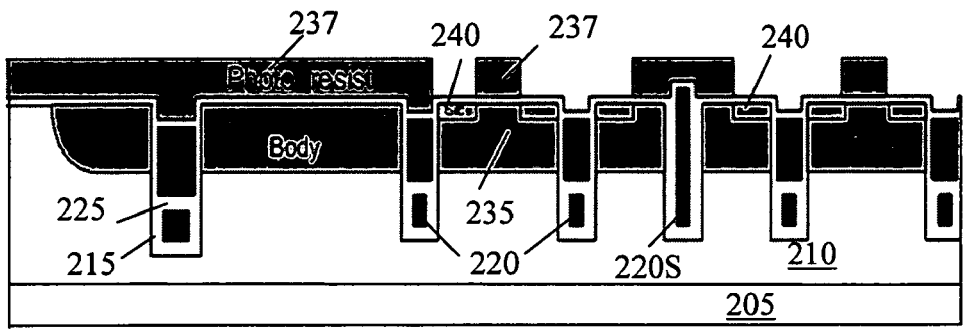
Figure 4K:
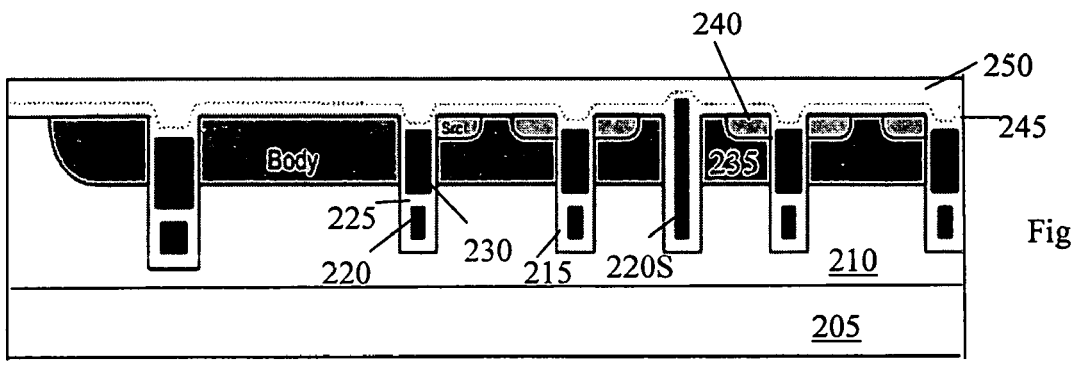

In FIG. 4I, a body dopant implant to form a plurality of body dopant regions 235 is carried out by employing a body mask (not shown). This body mask excludes the body region from specific locations in the termination area leading to the formation of guard ring type termination structures. The termination area structure will allow the device to block high voltages. In FIG. 4J, the body mask is removed followed by a body diffusion to form the body regions 235. The body drive diffuses the dopant to the desired depth that is no deeper than the upper gate electrode. Then a fourth mask, i.e., the photoresist as source mask 237, is applied to carry out a source dopant implant to form a plurality of source dopant regions 240. A local oxide thinning may be necessary before the source is implanted. In FIG. 4K, the photoresist layer 237 is removed, followed by applying an elevated temperature to diffuse the source regions 240. After a source drive, the LTO layer 245 and BPSG layer 250 are deposited. Then, a BPSG flow process is performed.

Figure 4L:
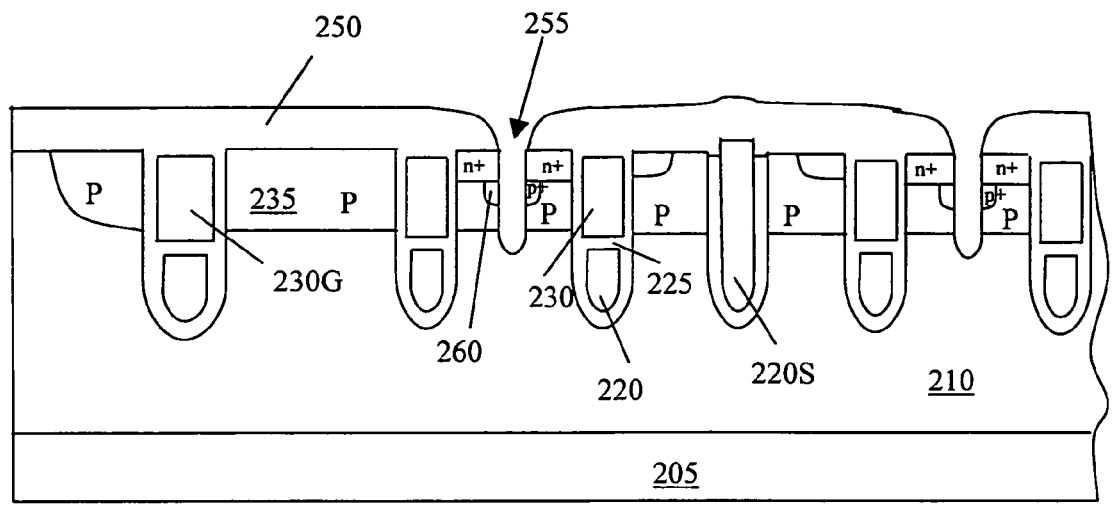
Figure 4M:
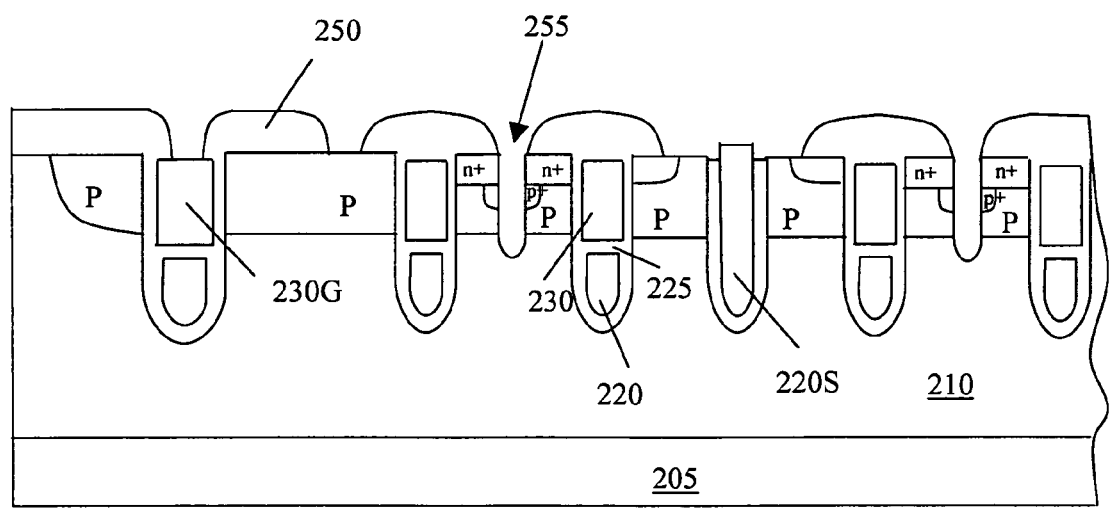
Figure 4N:
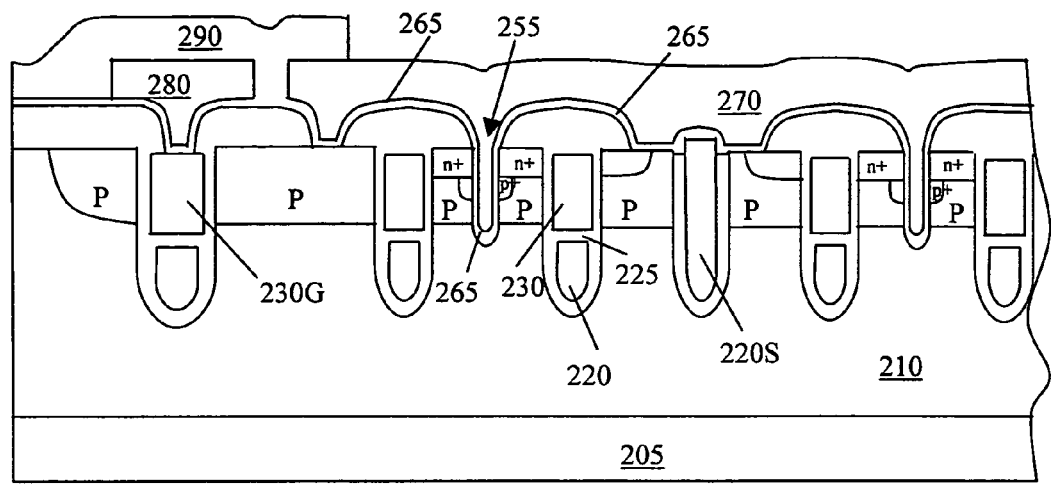

In FIG. 4L, a contact first mask (not shown) is applied to open the source contact trenches 255 by etching through the BPSG layer 250 and the LTO layer 245 then extending through the body regions 235 and into the epitaxial layer 210. The source contact trenches 255 are opened in the mesa contact areas between the trenched gates 230. The contact mask (not shown) is then removed. An angular P+ implant is carried out to form punch through prevention and ohmic contact regions 260 along the sidewalls of the source contact trenches 255. In FIG. 4M a second contact mask (not shown) is applied to open gate contact openings above some of the trenched gate runner 230G and source contact openings 195 above some of the trenched source connecting electrode 220S. In FIG. 4N, a layer of contact metal 265, such as a Ti or TiSi2 layer, is disposed in the contact trenches 255 as well as on top of the gate oxide after the second contact mask (not shown) is removed. The metal layer 265 is a low barrier height metal with the portion that covers the bottom portion of the source contact trenches 255 to function as an Schottky barrier diode. A high barrier height metal such as platinum is therefore not required. The Schottky barrier disposed near the bottom of the source contact trenches 255 provides an advantage of bypassing the body diode. After the deposition of the Ti or TiSi2 metal layer, an option layer of TiN may be applied to protect Ti or TiSi2 from oxidation, then a contact metal layer is deposited on top and a metal mask (not shown) is applied to etch the metal layer into a source metal 270 and a gate metal 280. A silicon nitride passivation layer 290 is deposited on top of the device and a passivation mask (not shown) is applied to pattern the passivation layer 290 to cover the gate metal 280 and the gap separating the gate metal 280 and the source metal 270 while keeping the source metal exposed for external connection to a specific voltage, e.g., a ground voltage.

Figure 5A:
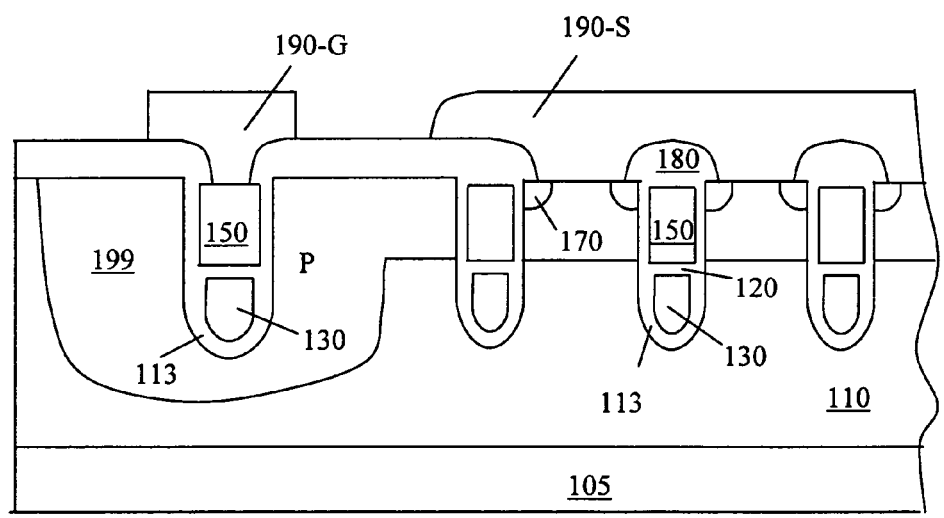
FIGS. 5A and 5B are two side cross sectional view of two alternate embodiments of this invention with specially configured termination area of a MOSFET device and tapered gate respectively.

FIG. 5A shows a MOSFET device with specially configured termination area for operation as a device for higher voltage rating. For a high voltage operation, the formation of the termination area requires a well-controlled placement of trenches filled with the source polysilicon and a thick oxide. FIG. 5A shows an alternate embodiment to this method. A deep p− region 199 is implanted and diffused at the outset of the process to form a guard ring or Junction-termination extension type termination. The guard ring or junction-termination extension formed with the p− region 199 surrounds the gate 150 in electrical contact with the gate metal 190-G.

Figure 5B:
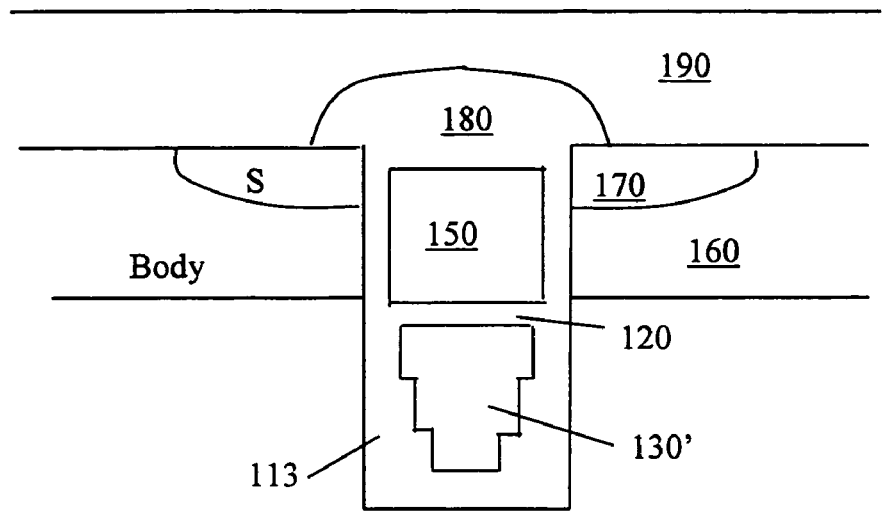

FIG. 5B shows an alternate trenched gate configuration formed with a more complex process with a tapered oxide structure in the bottom shielding electrode 130' of the shield gate trench (SGT) disposed below the trenched gate 150. The first oxidation is carried out to the greatest desired thickness. After the polysilicon deposition and poly etch to a desired depth, a wet etch is performed to etch the oxide to a thinner oxide layer thickness along the trench sidewalls. A second polysilicon deposition and etch back is performed to a desired depth. The above processes are applied several times to provide a tapered polysilicon SGT structure 130' as shown in FIG. 5B. At the penultimate polysilicon etch step, a mask is applied to leave the polysilicon flush with the top surface in the center of the source contact. Thereafter, the process is the same as the one shown above. Another approach to form such a graded oxide on the trench sidewall is to create a grading in implanted damage from a neutral species such as oxygen. Performing multiple implants into the sidewall at different angles provides the grading in implanted damage. The vertical implant has the highest dose for maximum damage. As the angle is increased, the dose is reduced to reduce the damage. Next, a single wet oxidation produces a tapered oxide profile along the sidewall. The advantage of the tapered oxide thickness is to allow the use of a flatter epitaxial doping profile. The doping profile is easier to control to achieve the same Rds performance.

Figure 6A:
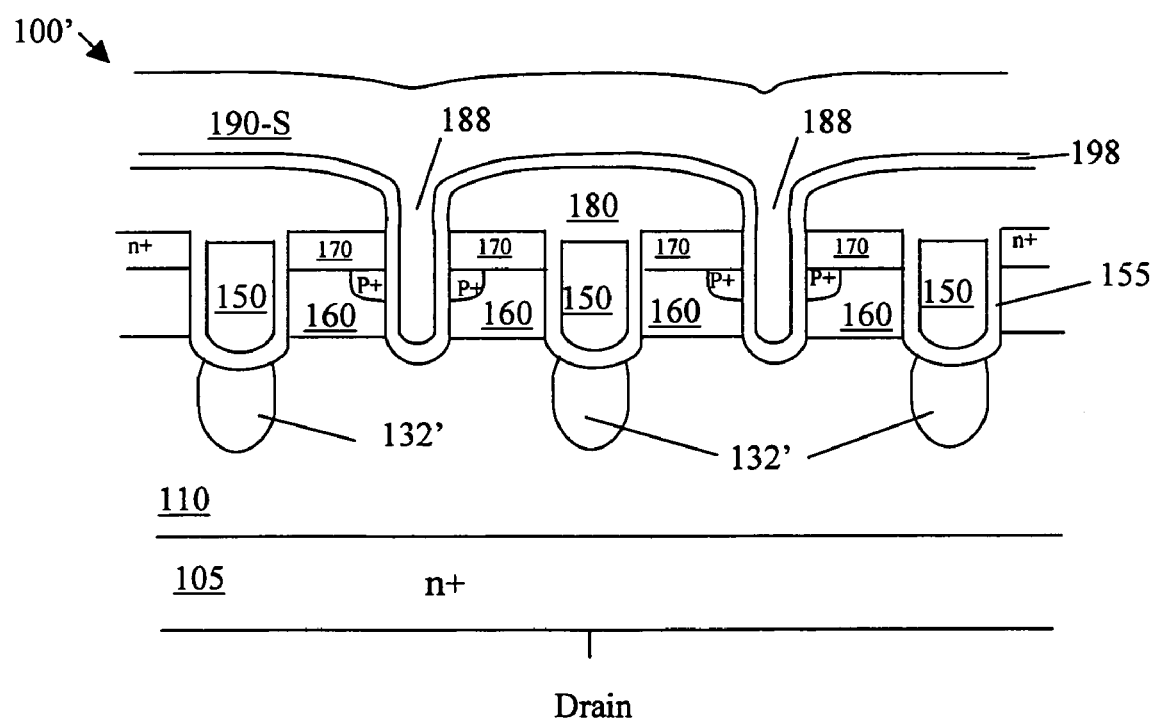
FIGS. 6A and 6B are cross sectional views of two alternate embodiments of this invention of a MOSFET device with specially configured gate-to-drain shielding structure to reduce the gate to drain capacitance and including Schottky barrier diode through source contact trenches covered with low barrier height metal layer.
Figure 6B:
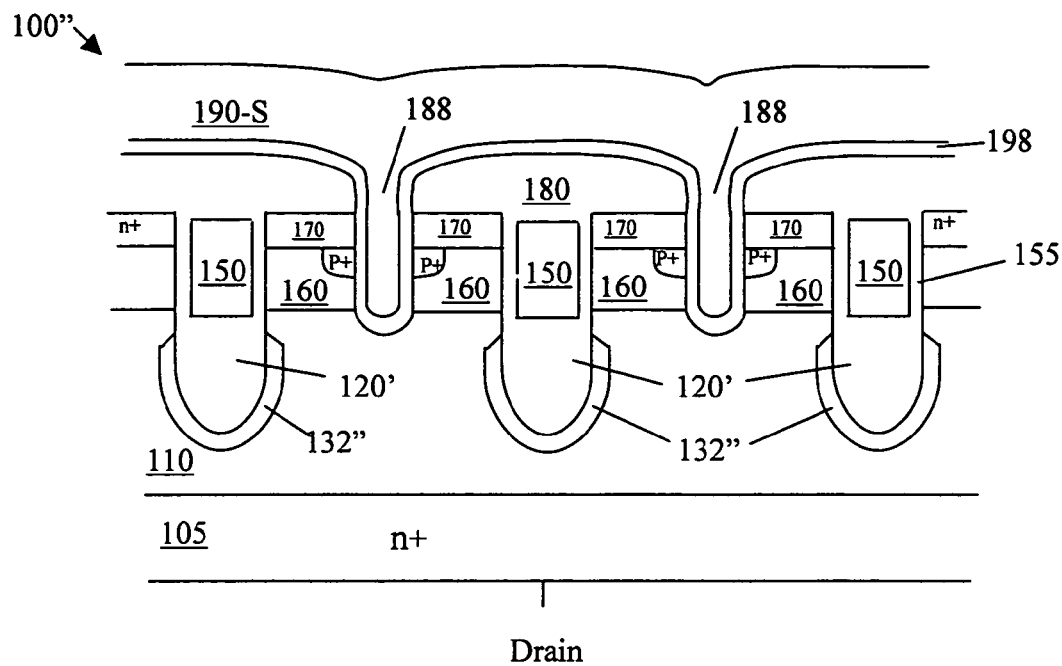

FIGS. 6A and 6B are two cross sectional views of two different DMOS devices as two alternate embodiments of this invention. The DMOS devices 100' and 100" are similar to that shown in FIGS. 3A to 3D except that there are no SGT structure in DMOS device 100' and 100". Instead of a "split gate" structure with a bottom shielding electrode as that shown in FIGS. 3A to 3D, the DMOS device 100' has different gate-to-drain shielding regions 132' formed as body dopant region disposed below the trenched gates 150. The gate-to-drain shielding regions 132' may be formed by high-energy implantation followed with activation at elevated temperature after the gate trenches are etched. The DMOS device 100" shown in FIG. 6B has a gate-to-drain shielding structure includes a thick oxide layer 120's disposed at the bottom portion below the trenched gate 150 and a P dopant region 132" surrounding the bottom and lower portions of the sidewalls of the thick oxide layer 120' filling the bottom portion in the trench below the trenched gates 150. P dopant region 132" may be formed in a similar way as P dopant region 132' in FIG. 6A with a second gate trench etch to extend the gate trench into P dopant region 132". Thick oxide 120' may be form by a CVD process. Again, the low barrier height metals layer 198 composed of Ti or TiSi2 covering the source contact trenches 188 to function as Schottky barrier diode and integrated into every cell to improve the performance of the device.

Figure 7A:
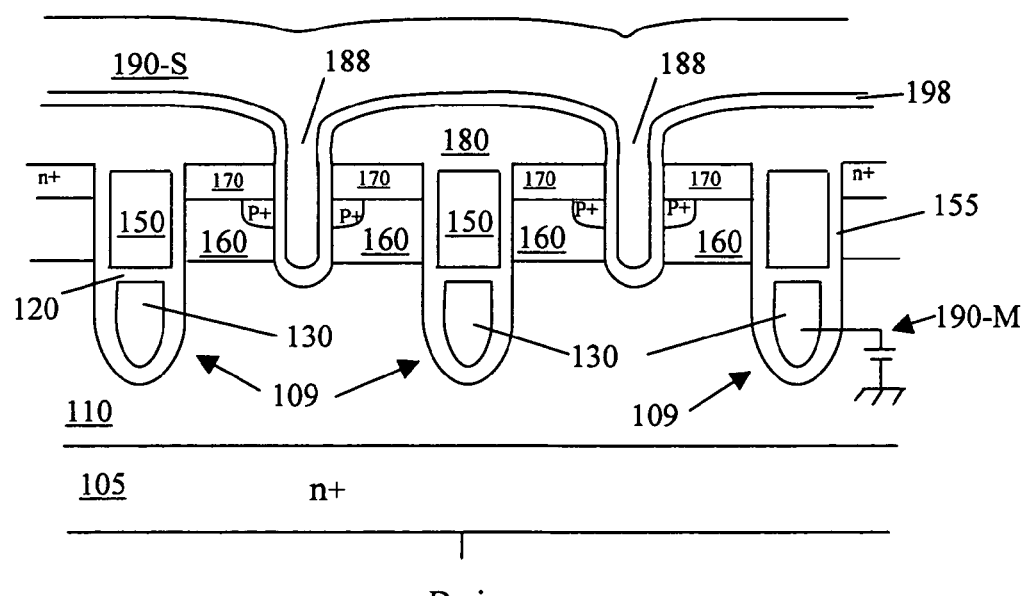
FIG. 7A shows cross sectional view of a DMOS cell of this invention with the bottom shielding electrode connected to a potential other than a ground voltage.
Figure 7B:
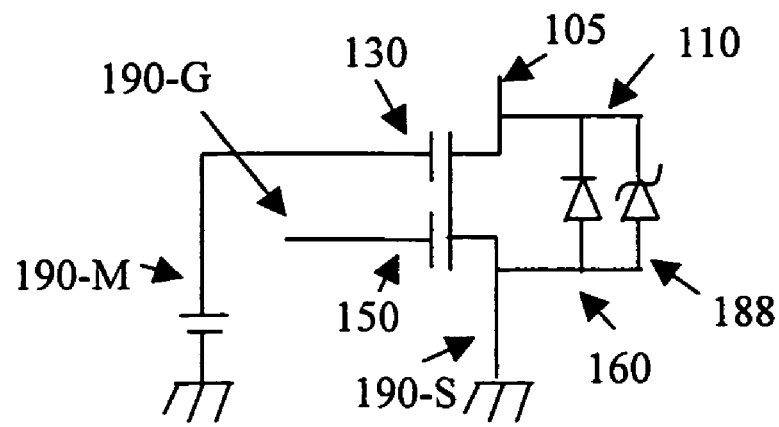
FIG. 7B shows an equivalent circuit and FIG. 7C shows a top view of the device that includes a source metal, a gate pad and a lower gate pad.
Figure 7C:
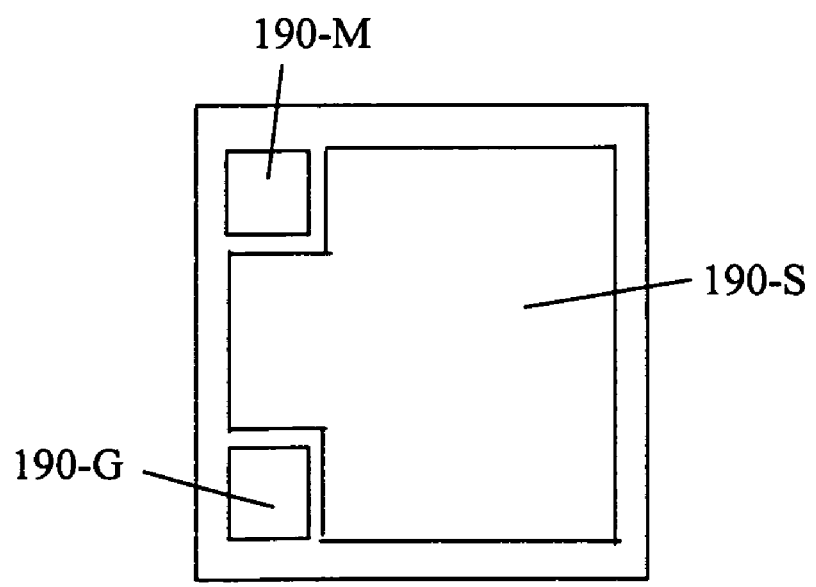

FIGS. 7A-7C shows a special implementation configuration and its equivalent circuit of this invention with the bottom shielding electrode 130 connected to a voltage implemented as a separate lower gate pad 190-M shown in FIG. 7C. The leakage current can be modulated with better control when the lower electrode 130 in the deep trench 109 is connected to a separate DC potential other than the source potential. A different configuration can also be implemented by allowing the lower electrode 130 as a floating electrode without connecting it to a specific voltage. The lower gate pad 190-M may be formed in a dedicated area at the same time the gate pad 190-G is formed. Instead of forming macro cell structure as in FIGS. 3A-3C where a trenched source connecting electrode 140 is formed in each macro cell, the trenched source connecting electrode in FIG. 7C may be form only in the dedicate region underneath the lower gate pad 190-M to electrically connect the lower gate 130 to lower gate pad 190-M.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device comprising a plurality of power transistor cells surrounded by a plurality of trenches opened in a semiconductor substrate wherein:
    at least one of said cells constituting an active cell having a source region disposed next to a trenched gate having a gate material filling in said trenches electrically connecting to a gate pad and surrounding said cell wherein said trenched gate further having a bottom shielding electrode filled with a conductive material disposed below and insulated from said trenched gate;
    at least one of said cells constituting a connecting cell surrounded by said trenches with a portion functioning as a connecting trench filled with said conductive material as a connecting electrode for electrically connecting between said bottom shielding electrode and a metal disposed directly on top of said connecting trench; and
    at least an active cell further includes a trenched source contact opened between said trenches wherein said trenched source contact opened through a source region into a body region for electrically connecting the source region to a source metal disposed on top of an insulation layer wherein a trench bottom surface of said trenched source contact further covered with a conductive material to function as an integrated Schottky barrier diode in said active cell.

2. The trenched power semiconductor power device of claim 1 wherein:
    said conductive material covering said trench bottom surface of said source contact trench includes a low barrier height material.

3. The trenched power semiconductor power device of claim 1 wherein:
    said conductive material covering said trench bottom surface of said source contact trench includes a Ti/TiN or TiSi$_2$/TiN material.

4. The trenched power semiconductor power device of claim 1 further comprising:
    a punch through prevention region doped with a body dopant disposed below said source region along trench walls of said source contact trench.

5. The trenched power semiconductor power device of claim 1 further comprising:
    an insulation protective layer disposed on top of said semiconductor power device having a plurality of openings opened therethrough wherein said plurality of openings disposed on top of said connecting trench provided for electrically connecting to said metal disposed directly on top of said connecting trench.

6. The semiconductor power device of claim 1 further comprising:
    at least a gate pad opening opened through said insulation protective layer provided for electrically connecting said gate pad to said trenched gate through a trenched gate runner.

7. The semiconductor power device of claim 6 wherein:
    said gate pad opening disposed directly above the trenched gate runner.

8. The semiconductor power device of claim 6 wherein said trenched gate runner is wider and deeper than other SGT trenches.

9. The semiconductor power device of claim 6 wherein:
    said trenched gate runner further includes a SGT structure at a bottom of said trenched gate runner.

10. The semiconductor power device of claim 1 wherein:
    said trenched gate is surrounded by an insulation layer covering an upper portion of trench sidewalls of said trenched gate wherein said insulation covering said upper portion of said sidewalls is thinner than an insulation layer in a lower portion of trench sidewalls for insulating said bottom shielding electrode.

11. The semiconductor power device of claim 1 wherein each of said cells further includes a body region disposed between said trench surrounding said cells wherein said body region in said active cell encompassing said source region disposed next to said trenched gate.

12. The semiconductor power device of claim 1 wherein:
    an oxide layer is disposed above said bottom shielding electrode to insulate said bottom shielding electrode from said trenched gate wherein said oxide layer above said bottom shielding electrode is disposed in said trench with a predefined depth controlled by a timed etch process.

13. The semiconductor power device of claim 1 wherein:
    said bottom shielding electrode filled with said gate material having a stepwise tapered profile toward a bottom of said trench with a lining layer surrounded said gate material having a correspondingly stepwise increased thickness.

14. The semiconductor power device of claim 1 wherein:
    said bottom shielding electrode filled with said gate material having a tapered profile toward a bottom of said trench with a lining layer surrounded said gate material having a correspondingly gradually increased thickness.

15. The semiconductor power device of claim 1 further comprising:
a termination area including a deep p– region to form a guard ring or a Junction-termination extension type termination.

16. The semiconductor power device of claim 15 wherein:
said deep p– region forming a guard ring or Junction-termination extension type termination is deeper than said gate runner trench.

17. The semiconductor power device of claim 1 wherein:
said bottom shielding electrode is connected to a voltage implemented as a separate lower gate pad.

18. The semiconductor power device of claim 1 wherein:
said bottom shielding electrode is connected is connected to the source.

19. The semiconductor power device of claim 1 wherein:
said bottom shielding electrode is opened to function as a floating electrode.

20. The semiconductor power device of claim 1 wherein:
said trenched connecting electrode is disposed in a dedicated area on said semiconductor power device for connecting said trenched connecting electrode to a separate contact pad near said dedicated area.

* * * * *